United States Patent
Lai et al.

(10) Patent No.: US 6,448,137 B1
(45) Date of Patent: Sep. 10, 2002

(54) METHOD OF FORMING AN NROM EMBEDDED WITH MIXED-SIGNAL CIRCUITS

(75) Inventors: Erh-Kun Lai, Tai-Chung Hsien (TW);
Chien-Hung Liu, Taipei (TW);
Shyi-Shuh Pan, Kao-Hsiung (TW);
Shou-Wei Huang, Chi-Lung (TW);
Ying-Tso Chen, Kao-Hsiung Hsien (TW)

(73) Assignee: Macronix International Co. Ltd., Hsin-Chu (TW)

(*) Notice: Subject to any disclaimer, the term of this patent is extended or adjusted under 35 U.S.C. 154(b) by 0 days.

(21) Appl. No.: 09/682,941

(22) Filed: Nov. 2, 2001

(51) Int. Cl.[7] .......................................... H01L 21/8247
(52) U.S. Cl. ...................................... 438/258; 438/981
(58) Field of Search ................................ 438/258, 238, 438/239, 253, 257, 981

(56) References Cited

U.S. PATENT DOCUMENTS 5,151,375 A * 9/1992 Kazerounian et al. . 365/185.13
5,674,762 A * 10/1997 See et al. ................... 438/234
5,908,311 A * 6/1999 Chi et al. .................... 438/258
5,970,338 A * 10/1999 Tempel ........................ 438/152

* cited by examiner

*Primary Examiner*—Richard Booth
(74) *Attorney, Agent, or Firm*—Winston Hsu

(57) ABSTRACT

A method of forming an NROM comprising mixed-signal circuits is provided. The method starts by providing a semiconductor substrate having a memory area and a periphery area. The periphery area has a plurality of active areas isolated by an isolation layer. A bottom electrode of a capacitor is formed atop the isolation layer in the periphery area. An ONO(oxide-nitride-oxide) process is performed. A photolithography, an anisotropic etching, and an ion implantation process are performed in order to etch the ONO dielectric layer in a bit line region not protected by the first photolithography process, and to form a plurality of buried bit lines. A photolithography and an ion implantation process are performed in order to form at least one ion well. The surface of the active area in the periphery area is wet etched. An oxidation process is performed in order to simultaneously form at least one gate oxide layer with a specific thickness in the active area, and to form a thermal oxide layer atop each of the buried bit lines in the memory area. Each of the gates, the top electrode of the capacitor and the resistor are formed in the periphery area, and a word line is formed in the memory area.

27 Claims, 21 Drawing Sheets

METHOD OF FORMING AN NROM EMBEDDED WITH MIXED-SIGNAL CIRCUITS

BACKGROUND OF INVENTION

1. Field of the Invention

The present invention relates to forming nitride read only memory (NROM), and more particularly, to a method of forming an NROM embedded with mixed-signal circuits.

2. Description of the Prior Art

Nitride read only memory (NROM) is a semiconductor device for data storage. It is composed of a plurality of memory cells. Each of the memory cells comprises a MOS transistor and an ONO gate dielectric layer. Since the silicon nitride layer in the ONO gate dielectric layer is a highly dense material, hot electrons can be trapped in the silicon nitride layer by way of tunneling through the MOS transistor, in order to store data. Although NROM has an advantage of a two bit multi-storage function, a simpler manufacturing process than similar products, such as flash ROM, and being widely welcomed by the market, it is not good enough to just make conventional improvements. Because, the semiconductor industry is orienting itself toward the development of system on chip (SOC) products, in other words, products in which are simultaneously manufactured memory devices and the circuits devices, so as to make a single chip comprise memory and mixed-signal circuits. In U.S. Pat. No. #5,908,311, a method of forming a mixed-signal circuits comprising the flash ROM is proposed. Based on different characteristics and applications of NROM and flash ROM, it is a very important issue to develop a system on chip which integrates NROM and mixed-signal circuits.

Please refer to FIG. 1 to FIG. 10. FIG. 1 to FIG. 10 are schematic diagrams of a process for making the mixed-signal circuits comprising flash ROM. As shown in FIG. 1, the mixed-signal circuits comprising flash ROM according to the prior art are made on a surface of a semiconductor substrate 10. The semiconductor substrate 10 comprises a P$_+$substrate 12, and a P$^-$epi layer 14. The surface of the semiconductor substrate 10 comprises a memory area 11 and a periphery area 13. The periphery area 13 further comprises a 3-volt transistor area 15 and a 5-volt transistor area 17. An N-well region 16 of MOS, a P-well region (not shown) of MOS, a channel stop implant 18, and at least a field oxide region (FOX) 22 are in the periphery area 13. A P-well region 23 is in the memory area.

The prior art method is to form a sacrificial oxide layer 24 on the surface of the semiconductor substrate 10 first, then perform a first photolithography process and form a first mask 25 in order to expose the 5-volt transistor region 17 in the N-well region 16. Thereafter, perform a first ion implantation process in order to adjust the threshold voltage of the 5-volt transistor (not shown) in the N-well region 16. After that, perform a second photolithography process and a second ion implantation process in order to adjust the threshold voltage of the 5-volt transistor (not shown) in the P-well region (not shown).

As shown in FIG. 2, after adjusting the threshold voltage of the 5-volt transistor (not shown), the sacrificial oxide layer 24 is removed completely. Then form a sacrificial oxide layer 28 on the surface of the semiconductor substrate 10. Thereafter, perform a third photolithography process to expose the memory region 11 by utilizing a third mask 32. Then perform a third ion implantation process in order to adjust the threshold voltage of the memory cell (not shown).

As shown in FIG. 3, after adjusting the threshold voltage of the memory cell (not shown), remove the sacrificial oxide layer 28 in the memory area 11, then remove the third mask 32. After that form a sacrificial oxide layer 34 in the memory area 11. The formation of the sacrificial oxide layer 34 will contribute to a thickness increase of the sacrificial oxide layer 28 in the periphery region 13. However, the growth rate of the sacrificial oxide layer 34 is obviously larger than that of the sacrificial oxide layer 28 in this process step.

As shown in FIG. 4, form a first polysilicon layer 36 on the surface of the sacrificial oxide layer 28, the sacrificial oxide layer 34 and the field oxide layer 22, then perform a fourth photolithography process and form a fourth mask 37. The fourth mask 37 exposes the predetermined site 39 of the resistor in the periphery area 13 and the memory area 11. Thereafter, perform a fourth ion implantation process in order to dope the predetermined site 39 of the resistor in the periphery area 13 and the memory area 11 with low doping. After that remove the fourth mask 37. Then perform a fifth photolithography process (not shown) and a fifth ion implantation process (not shown) in order to dope the region outside of the predetermined site 39 of the resistor in the periphery area 13 and the memory area 11 with high doping.

As shown in FIG. 5, perform a sixth photolithography process in order to form a sixth mask 41. The sixth mask 41 exposes the 3-volt transistor region 15 and defines the resistor 38, the bottom electrode 42 of the capacitor, the gate 44 of the 5-volt transistor (not shown) and the floating gate 46 of the flash ROM cell (not shown). Then, perform a first etching process in order to remove the first polysilicon layer 36 not covered by the sixth mask 41 and form at least a resistor 38, a bottom electrode 42 of the capacitor, a gate 44 of the 5-volt transistor (not shown) and the floating gate 46 of the flash ROM cell (not shown) on the semiconductor substrate 10. Thereafter, remove the sixth mask 41.

As shown in FIG. 6, form a bottom oxide-nitridetop oxide(ONO) 48 structure on the semiconductor substrate 10 that covers the resistor 38, the bottom electrode 42 of the capacitor, the gate 44 of the 5-volt transistor(not shown), the floating gate 46 of the flash ROM cell(not shown), the exposed field oxide layer 22 and the gate oxide layer 28 in the 3-volt transistor region 15. Then, perform a seventh photolithography process in order to form a seventh mask 49. The seventh mask 49 exposes the 3-volt transistor region 15. Thereafter, perform a second etching process in order to remove portions of the ONO layer 48 not covered by the seventh mask 49. After that, remove the seventh mask 49.

Please refer to FIG. 7. Perform an eighth photolithography process in order to form an eighth mask 52 on the surface of the ONO layer 48. The eighth mask 52 exposes the 3-volt transistor region 15 in the N-well region 16. Thereafter, perform a sixth ion implantation process in order to adjust the threshold voltage of the 3-volt transistor (not shown) in the N-well region 16. After that, perform a third etching process in order to remove the gate oxide layer 28 in the 3-volt transistor region 15, then remove the eighth mask 52. Thereafter, form a gate oxide layer 54 atop the 3-volt transistor region 15. After that, perform a ninth photolithography process and a seventh ion implantation process in order to adjust the threshold voltage of the 3-volt transistor (not shown) in the P-well region. Since the manufacturing of the 5-volt transistor (not shown), the resistor 38, the capacitor 54 and the flash ROM cell (not shown) occurs earlier than the manufacturing of the 3-volt transistor (not shown), the effect on the 3-volt transistor (not shown) resulting from improper heat treatment is avoided.

As shown in FIG. 8, form a second polysiliocn layer 56 on the semiconductor substrate 10 that covers the gate oxide layer 54, the exposed field oxide layer 22 and the ONO layer 48. Then, perform a doping process to the second polysilicon layer 56. Thereafter, as shown in FIG. 9, perform a tenth photolithography process in order to form a ninth mask 57 on the surface of the second polysilicon layer 56. The ninth mask 57 defines the gate 58 of the 3-volt transistor (not shown), the top electrode 62 of the capacitor 64 and the control gate (not shown) of the flash ROM cell (not shown). After that, perform a fourth etching process to completely remove portions of the second polysilicon layer 56 not covered by the ninth mask 57 and form at least a gate 58, a top electrode 62 of the capacitor 64 and a control gate 55 of the flash ROM cell (not shown) on the semiconductor substrate 10.

As shown in FIG. 10, perform an eleventh photolithography process in order to form a tenth mask 63, the tenth mask 63 covering the 3-volt transistor region 15, the resistor 38 and the capacitor 64, and define the gate 44 of the 5-volt transistor 66. Then, perform a fifth etching process in order to remove the ONO layer 48 and the first polysilicon layer 36 not covered by the tenth mask 63. Finally, remove the ninth mask 57 and the tenth mask 63 and complete the manufacturing of the 3-volt transistor 68 and the flash ROM cell 72.

After completing the above process, form an oxide layer for sealing the polysilicon layer on the semiconductor substrate 10. Then, perform a pocket ion implantation process optionally to the drain of the flash ROM cell 72 by forming a mask and performing angled implantation. Finally, perform a back-end process. The back-end process is the same as a general adapted back-end process and comprises forming the lightly doped drain (LDD) of the transistor in the periphery area, the contact hole, the via and the metal layer. The mask for forming the lightly doped drain also exposes the source of the flash ROM cell 72.

According to the prior art method for forming the flash ROM comprising mixed-signal circuits, not only are the process steps very complex and lead to a high cost, but there is also only one choice for the composition of the dielectric layer of the capacitor. Also, in regard to the functionality of devices, the flash ROM can only store one bit each time. In other words, it does not have a multi-storage function. Therefore, it is a very important subject to improve or resolve the above mentioned issues.

SUMMARY OF INVENTION

It is therefore a primary objective of the present invention to provide a method of forming a nitride read only memory (NROM) embedded with mixed-signal circuits on a semiconductor substrate so as to achieve an objective of forming a system on chip (SOC).

It is therefore another objective of the present invention to preserve different dielectric layers of a capacitor by adjusting a cleaning and an etching process. For example, the combination of the dielectric layer of the capacitor can be top oxide-nitride-bottom oxide (ONO), nitride-bottom-oxide (NO), or bottom oxide(O) to provide the capacitor with varied dielectric constants in order to match the mixed-signal circuits.

It is therefore another objective to make the control gate of the NROM, the top electrode of the capacitor, the resistor and the gate of the MOS in the periphery area from the same polysilicon layer in order to reduce process steps and complexity of manufacturing. Briefly, the method according to the claimed invention comprises: (1) providing a semiconductor substrate, the surface of the semiconductor substrate comprising a memory area and a periphery area; (2) forming a bottom electrode of a capacitor atop an isolation layer in the periphery area; (3) forming an ONO layer that covers the memory area, the periphery are and the bottom electrode of the capacitor, the ONO layer comprising a bottom oxide layer, a silicon nitride layer and a top oxide layer; (4) forming a plurality of longitudinal bit line masks on the surface of the ONO layer in the memory area; (5) performing a first ion implantation process of a first conductive type at an angle not perpendicular to the ONO layer in order to form a plurality of pocket doping areas of the first conductive type in a region of the substrate not covered by the bit line mask; (6) etching a predetermined thickness of the bit line mask; (7) performing a second ion implantation process of a second conductive type in order to form a plurality of bit lines of the second conductive type in regions of the substrate not covered by the bit line mask; (8) removing the bit line mask; (9) removing the ONO layer on the active area in the periphery area and forming a plurality of ion wells in the active area; (10) performing a wet etching process in order to etch and clean the surface of the active area in the periphery area and etch a predetermined thickness of the dielectric layer of the capacitor; (11) performing at least one oxidation process in order to simultaneously form a gate oxide layer with a specific thickness in the active area in the periphery area and a thermal oxide layer atop each of the buried bit lines in the memory area; (12) forming a polysilicon layer, then performing a first photolithography process and a first anisotropic etching process in order to define a gate, a top electrode of the capacitor and a resistor in the periphery area and a control gate in the memory area; and (13) performing a third ion implantation process of a first or a second conductive type in order to adjust a resistivity value of the resistor.

It is an advantage of the present invention that the method of forming the NROM embedded with mixed-signal circuits can preserve different combinations of dielectric layers of the capacitor by adjusting the cleaning and etching processes, and further provide the capacitors with various dielectric constants in order to match with mixed-signal circuits. Moreover, the present invention only needs one polysilicon layer to fabricate the control gate of the NROM, the top electrode of the capacitor, the resistor and the gate of the MOS in the periphery area. Therefore, the process steps are simplifed and the cost is reduced.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
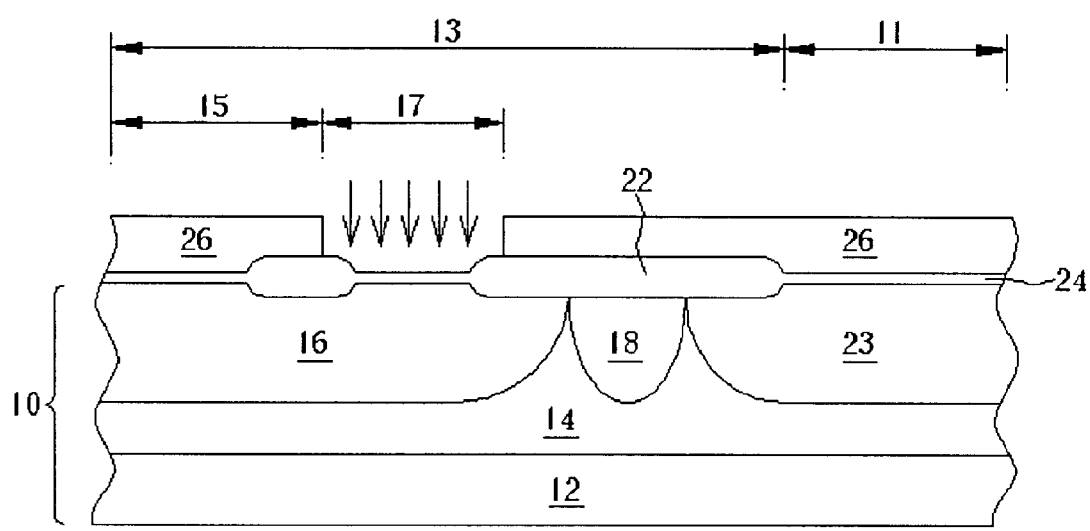
FIG. 1 to FIG. 10 are schematic diagrams of a process for forming flash ROM comprising mixed-signal circuits according to the prior art.
Figure 2:
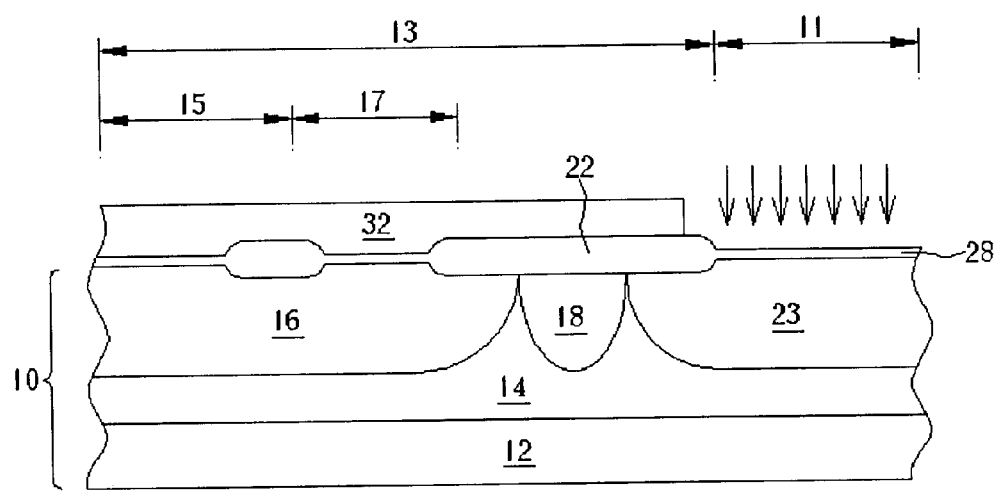
Figure 3:
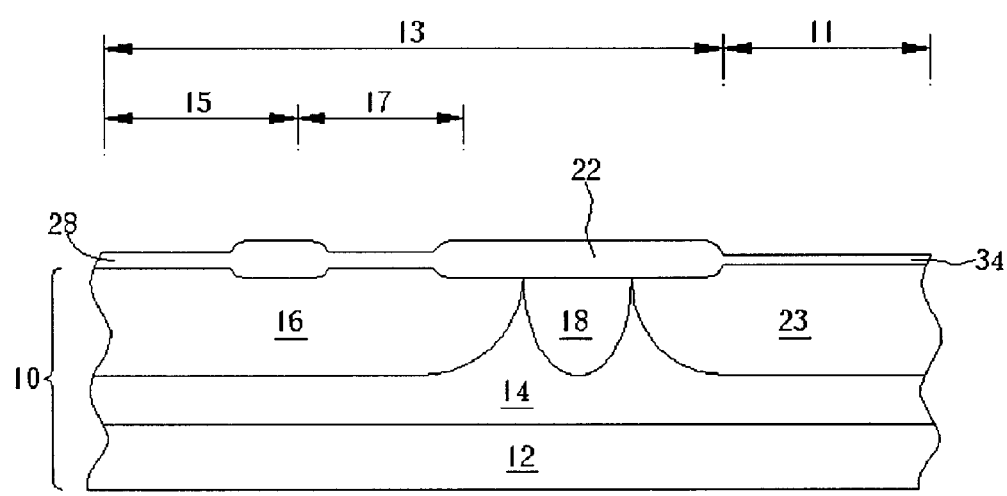
Figure 4:
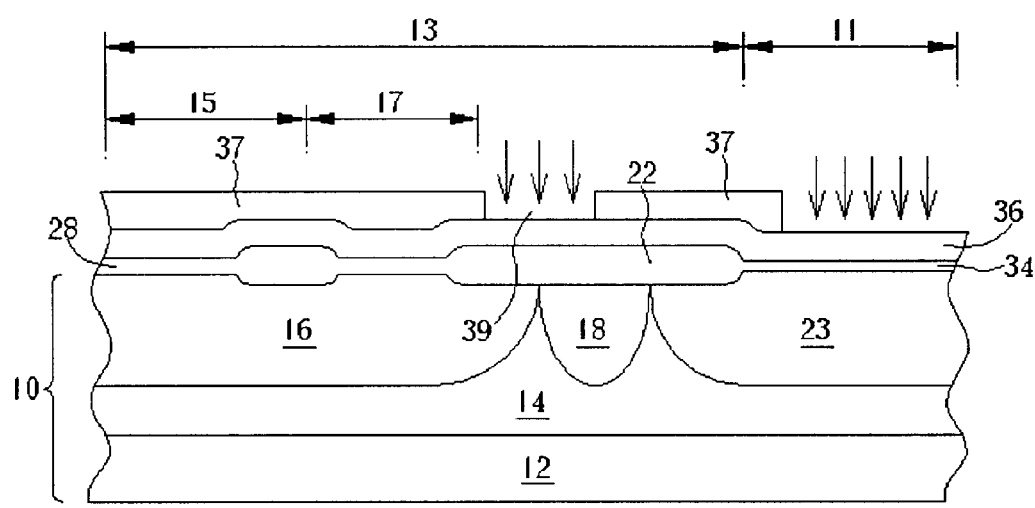
Figure 5:
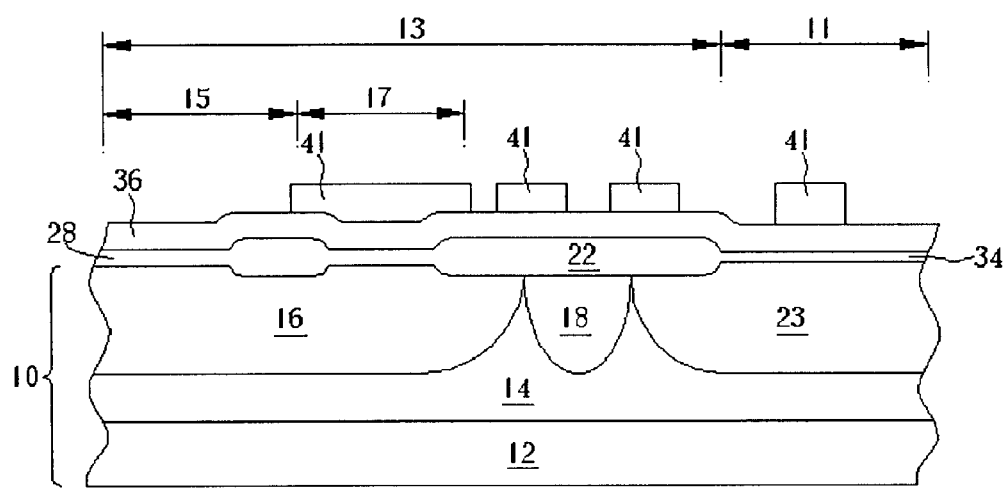
Figure 6:
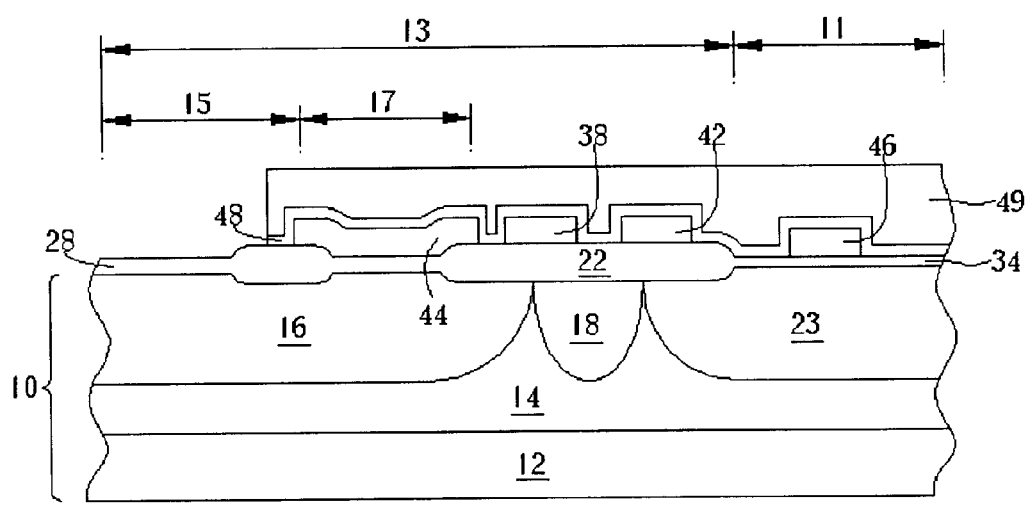
Figure 7:
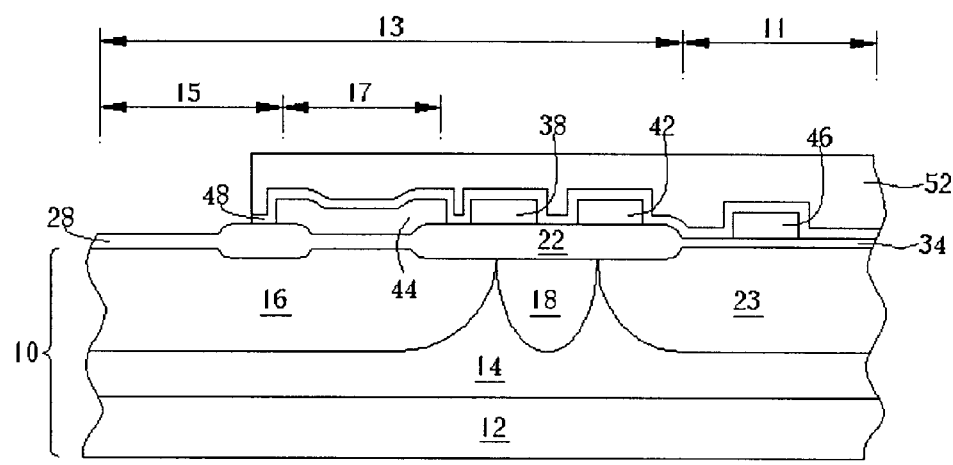
Figure 8:
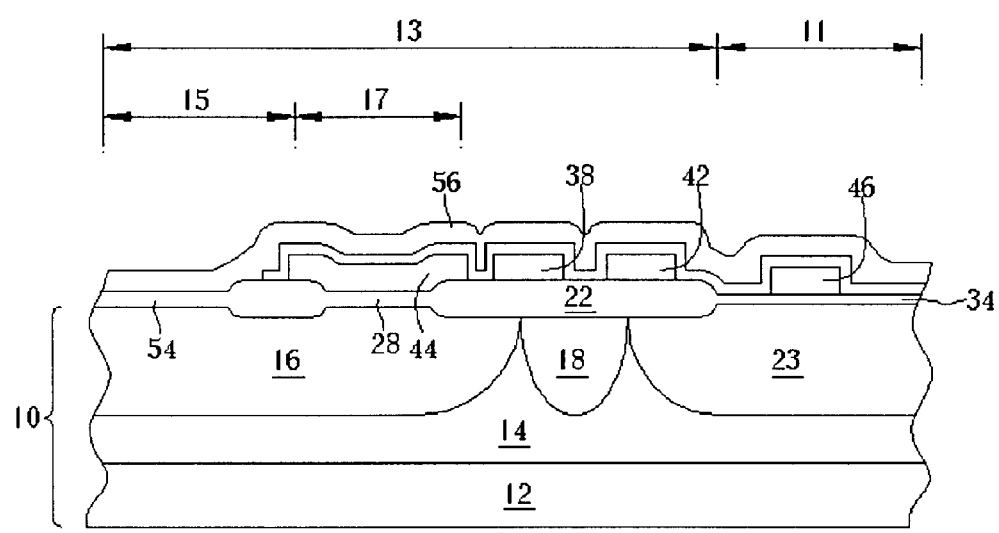
Figure 9:
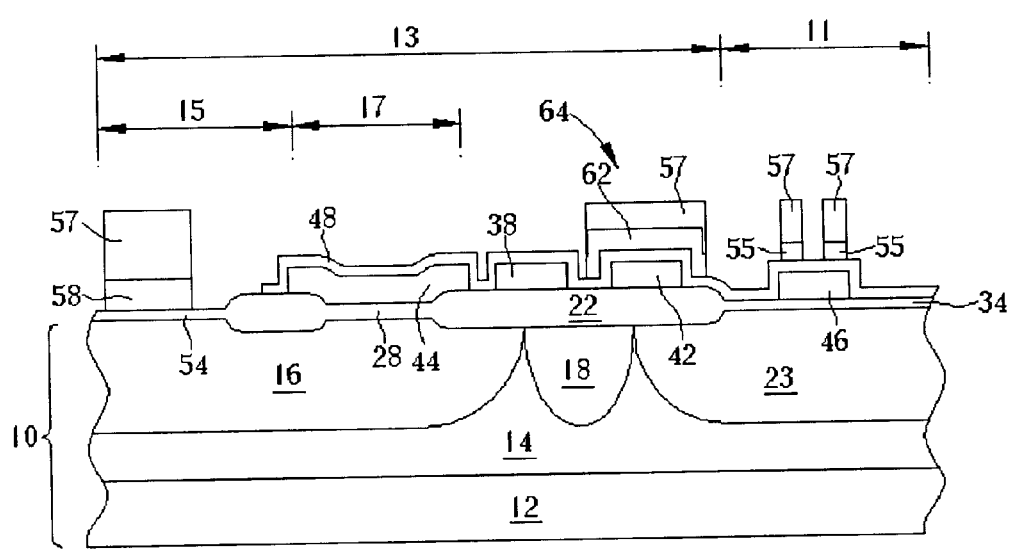
Figure 10:
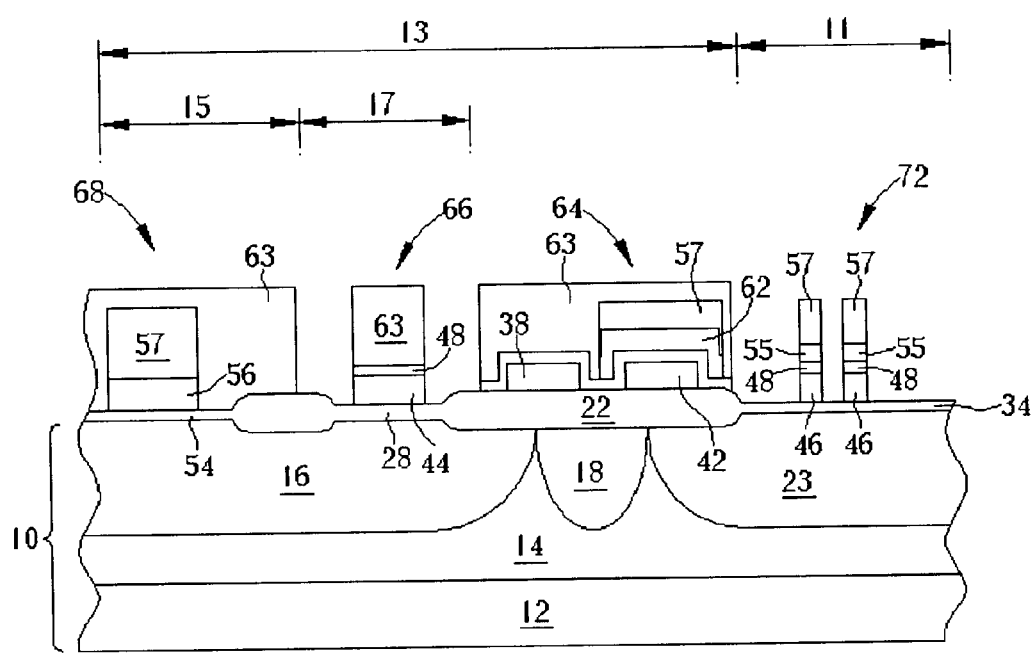
Figure 11:
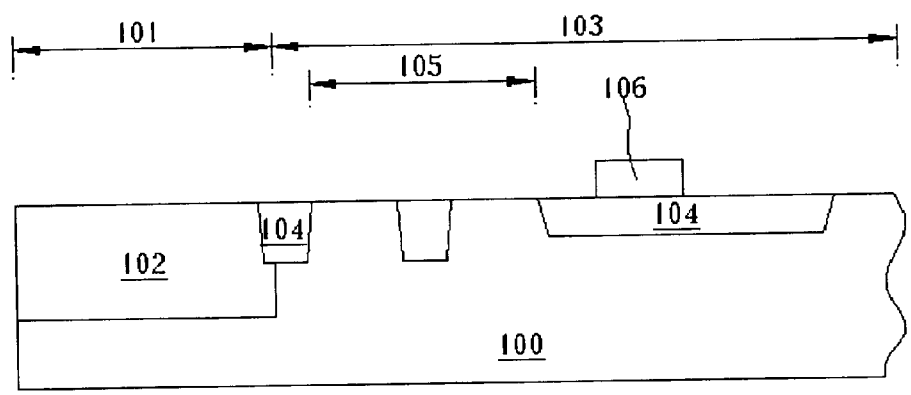
FIG. 11 to FIG. 21 are schematic diagrams of a process for forming NROM comprising mixed-signal circuits according to the present invention.

Please refer to FIG. 11 to FIG. 21. FIG. 11 to FIG. 21 are schematic diagrams of a process for forming NROM comprising mixed-signal circuits according to the present invention. As shown in FIG. 11, the NROM is formed on a semiconductor substrate 100. The surface of the semiconductor substrate 100 is divided into at least a memory area 101 and a periphery area 103. The semiconductor substrate 100 in the memory area 101 comprises at least a P-well 102, and the periphery area 103 usually comprises a low-voltage device area (not shown) and a high-voltage device area (not shown). The structure and a manufacturing process for the devices comprised in these two areas are about the same, but the main difference is the process parameters depending on device characteristics and the sequence of the manufacturing process, so the manufacturing process of each case will not be illustrated here, but they will be generalized as the manufacturing of the periphery area 103. The periphery area 103 comprises a plurality of active areas 105 isolated by an isolation layer 104.

The method according to the present invention is to apply the conventional deposition, photolithography and etching processes to form a bottom electrode 106 of the capacitor on the isolation layer 104 in the periphery area 103 on the semiconductor substrate 100. The bottom electrode 106 of the capacitor is composed of conductive material, such as metal or polysilicon, the selection of material and process conditions depending on device characteristics.

Figure 12:
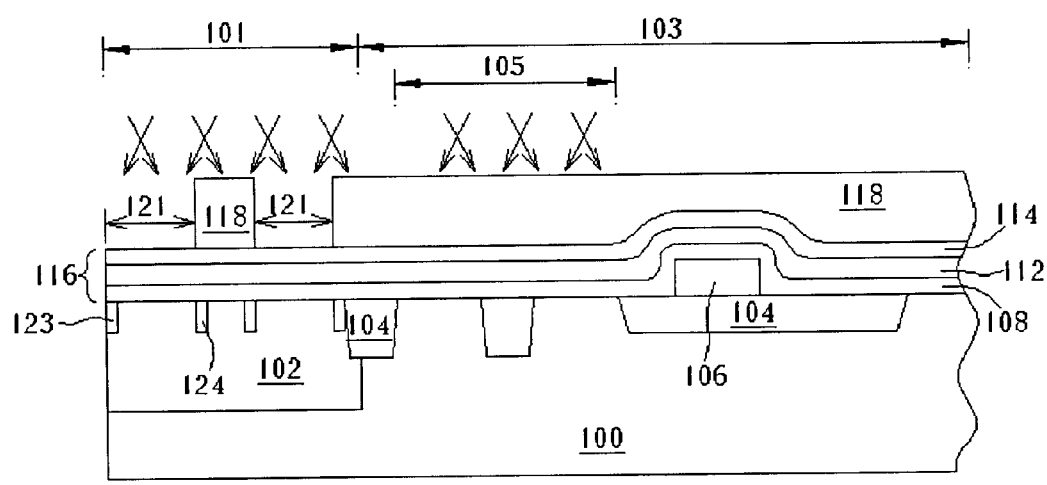

As shown in FIG. 12, perform a clean process on the semiconductor substrate 100, then perform an oxide-nitride-oxide (ONO) process so as to simultaneously form an ONO dielectric layer 116 combined with a bottom oxide layer 108, a nitride layer 112 and a top oxide layer 114 on the surface of the semiconductor substrate 100 and the bottom electrode 106 of the capacitor.

Then, perform a first photolithography process in order to form a first photoresist layer 118 on the surface of the ONO dielectric layer 116. The first photoresist layer 118 defines a pattern exposing a region for forming a buried bit line 122 in the memory area 101 and covers all of the periphery area 103. Thereafter, perform a first angled ion implantation process and a second ion implantation process by utilizing the first photoresist layer 118 as a mask in order to form a P-type pocket doping area 123 at one side of the bit line 122 and a P-type pocket doping area 124 at another side of the buried bit line in the memory area 101. The first angled ion implantation process and the second angled ion implantation process use about the same ion implantation parameters, except for a different incident direction.

Figure 13:
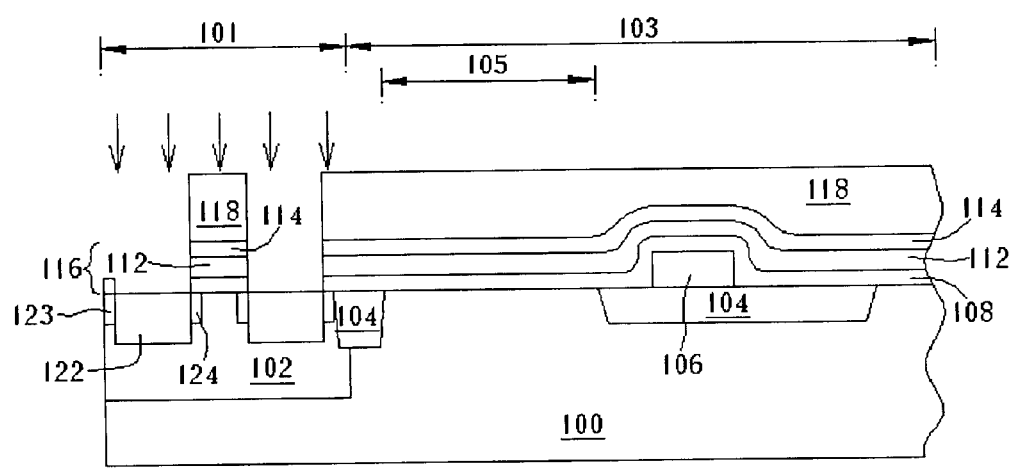

Please refer to FIG. 13. Perform an anisotropic etching process by utilizing the first photoresist layer 118 as a mask in order to remove the top oxide layer 114, the silicon nitride layer 112 and the bottom oxide layer 108 not covered by the first photoresist layer 118. After that, perform a first ion implantation process by utilizing the first photoresist layer 118 as a mask in order to form a plurality of buried bit lines 122 in portions of the semiconductor substrate 100 not covered by the first photoresist layer 118 in the memory area 101. Then, remove the first photoresist layer 118. The two neighboring buried bit lines 122 define a channel and the distance between the two neighboring bit lines 122 is the channel length. Furthermore, the advantage of forming the P-type doping areas 123, 124 is to provide a high electrical field area at one side of the channel, wherein the high electrical field lifts the velocity of electrons passing through the channel during programming. In other words, it accelerates electrons in order to have more electrons acquire enough dynamic energy through collisions or the scattering effect and to penetrate through the bottom oxide layer 108 into the nitride layer 112 to improve the writing efficiency.

Figure 14:
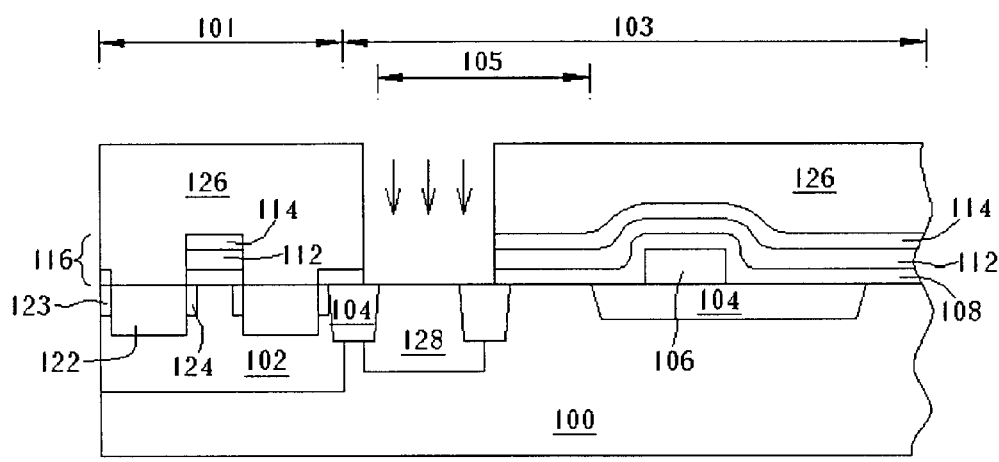

As shown in FIG. 14, perform a second photolithography process in order to form a patterned second photoresist layer 126 on the surface of the semiconductor substrate 100. The second photoresist layer 126 exposes the region for forming the N-type well 128 in the periphery area 103 and covers all of the memory area 101 and the bottom electrode 106 of the capacitor. Thereafter, perform an anisotropic etching process in order to remove portions of the top oxide layer 114, the silicon nitride layer 112 and the bottom oxide layer 108 in the ONO dielectric layer 116 not covered by the second photoresist layer 126 in the periphery area 103 and preserve a portion of the ONO dielectric layer 116 atop the bottom electrode 106 of the capacitor for use as the ONO dielectric layer of the capacitor. Finally, form at least one N-type well 128 in a portion of the semiconductor substrate 100 not covered by the second photoresist layer 126 in the periphery area 103 by utilizing the second photoresist layer 126 as mask. Then, remove the second photoresist layer 126.

Figure 15:
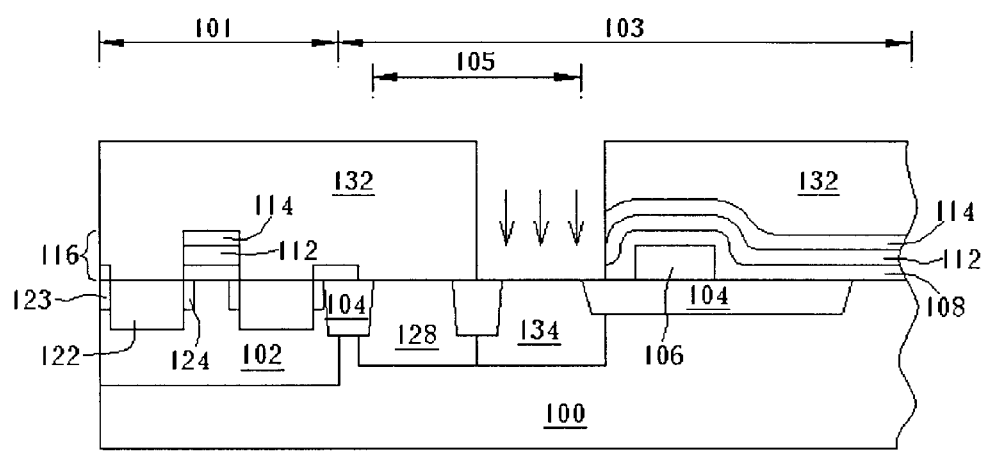

As shown in FIG. 15, perform a third photolithography process in order to form a third photoresist layer 132 on the surface of the semiconductor substrate 100. The third photoresist layer 132 exposes the region for forming the P-type well 134 in the periphery area 103 and covers all of the memory area 101 and the bottom electrode 106 of the capacitor. Thereafter, perform an anisotropic etching process in order to remove portions of the top oxide layer 114, the silicon nitride layer 112 and the bottom oxide layer 108 in the ONO dielectric layer 116 not covered by the third photoresist layer 132 in the periphery area 103 and preserve a portion of the ONO dielectric layer atop the bottom electrode 104 of the capacitor for use as the ONO dielectric layer of the capacitor. After that, form at least one P-type well 134 in portions of the semiconductor substrate 100 not covered by the third photoresist layer 132 in the periphery area 103 by utilizing the third photoresist layer 132 as a mask. Then, remove the third photoresist layer 132.

Figure 16:
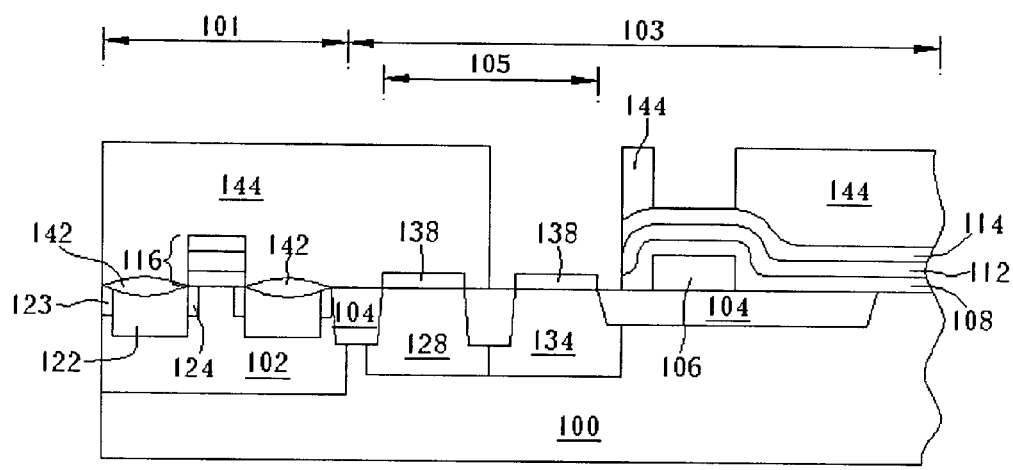
Figure 17:
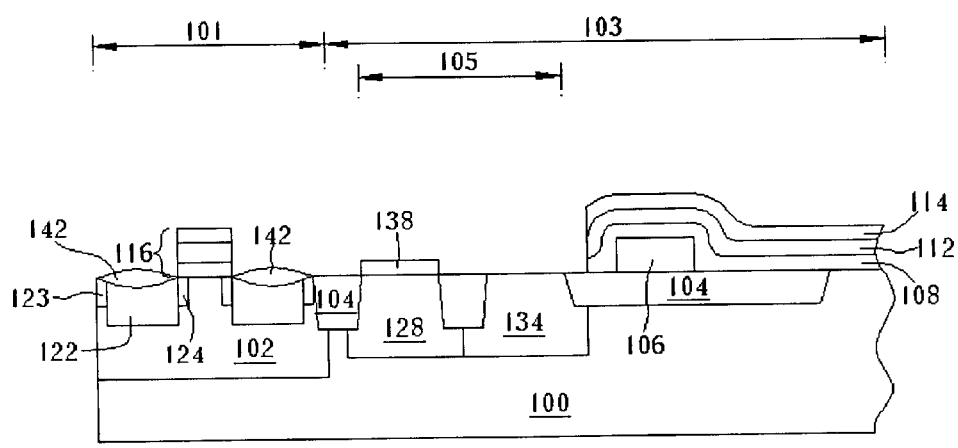

As shown in FIG. 16, perform an oxidation process in order to simultaneously form a gate oxide layer 138 with a first thickness on the active area in the periphery area 103, and a first thermal oxide layer 142 atop each of the buried bit lines 122 in the memory area 101. Then, perform a fourth photolithography process or a continuous process comprising deposition, photolithography and etching steps in order to form a fourth photoresist layer, or a mask layer 144, on the semiconductor substrate 100. The fourth photoresist layer, or the mask layer 144, covers all of the memory area 101 and exposes the bottom electrode layer 106 of the capacitor and part of the periphery area 103. Then, perform a cleaning and etching process in order to remove portions of the first thickness gate oxide layer 138 not covered by the fourth photoresist layer or the mask layer 144 in the periphery area 103. Finally, as shown in FIG. 17, remove the fourth photoresist layer or the mask layer 144.

Please note that when performing the above mentioned cleaning and etching process, the top oxide layer 114 in the ONO dielectric layer 116 of the capacitor, or the top oxide layer 114 and the silicon nitride layer 112 in the ONO dielectric layer 116 can be removed by different etching recipes depending on the requirements of different products. Furthermore, the portion of the ONO dielectric layer 116 atop the bottom electrode 106 of the capacitor can be covered to avoid the top oxide layer 114 and the silicon nitride layer 112 being etched in the cleaning and etching process when forming the fourth photoresist layer or the mask layer 144. In other words, if the top oxide layer 114 in the ONO dielectric layer 116 of the capacitor needs to be removed, an etching solution comprising hydrofluoric acid (HF) is applied. If the top oxide layer 114 and the silicon nitride layer 112 in the dielectric layer 116 of the capacitor need to be removed, an etching solution comprising hydrofluoric acid and an etching solution comprising a hot phosphorous acid ($H_3 PO_4$) are utilized. Oppositely, if the top oxide layer 114 and the silicon nitride layer 112 of the dielectric layer 116 of the capacitor need to be preserved, the fourth photoresist layer or the mask layer 144 need to cover the bottom electrode 106 of the capacitor before the cleaning and etching process is performed.

Figure 18:
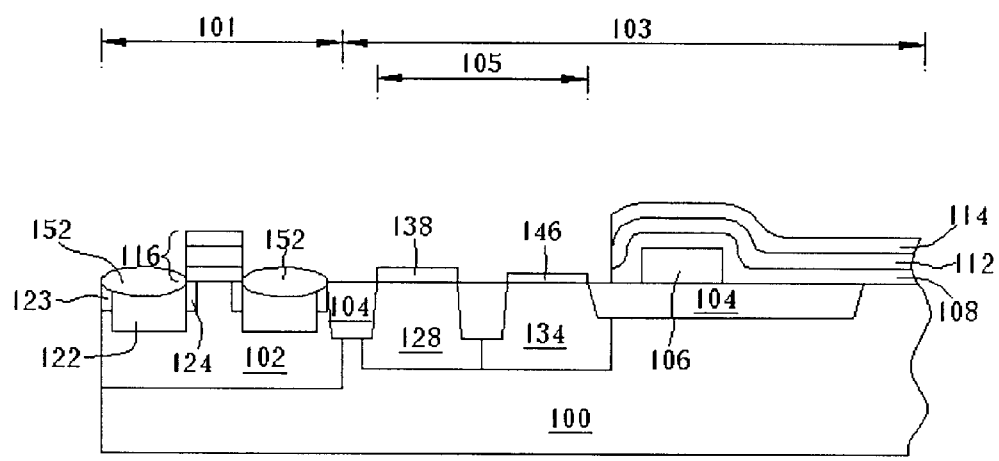

As shown in FIG. 18, after removing the fourth photoresist layer or the mask layer 144, an oxidation process is performed in order to form a gate oxide layer 146 with a second thickness on the active area in the periphery area 103, and a second thermal oxide layer 152 composite with the first thermal oxide layer 142 on the surface of the buried bit line 122 in the memory area 101. The thickness of the second thermal oxide layer 152 is approximately two times the specific thickness of the gate oxide layers 138,146 in the periphery area 103. In FIG. 18, only the first thickness gate oxide layer 138 and the second thickness gate oxide layer 146 of the low-voltage MOS (LV MOS) transistor on the semiconductor substrate 100 are shown. However, in a practical manufacturing process, gate oxide layers with various thicknesses can be obtained from differently defined regions of the photoresist layer when performing the repeated cleaning and etching process according to the present invention. Moreover, if there are high-voltage MOS (HV MOS) transistors on the semiconductor substrate 100, then a photolithography, etching and thermal oxidation process can be applied in order to form the gate oxide layer of the HV MOS transistor on the semiconductor substrate 100 after forming the ONO dielectric layer 116 combined with the bottom oxide layer 108, the silicon nitride layer 112 and the top oxide layer 114. Or, similar repeated cleaning and etching processes can be applied.

Figure 19:
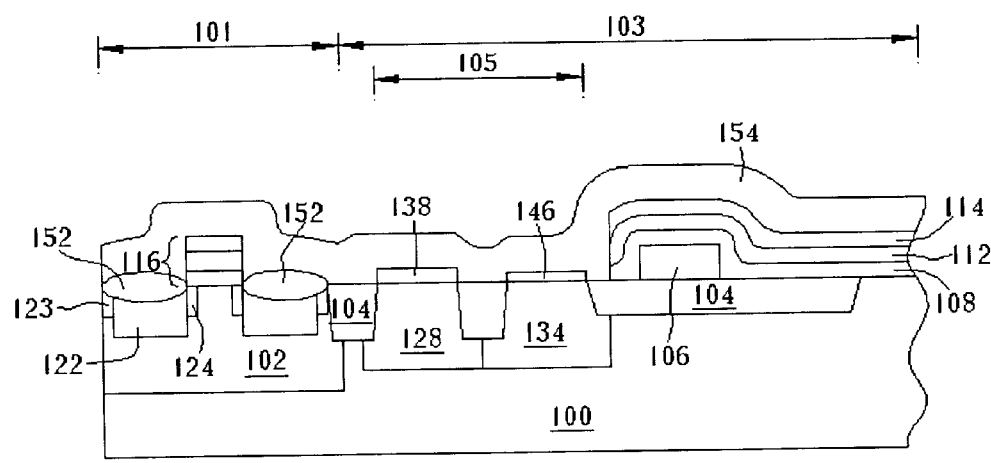
Figure 20:
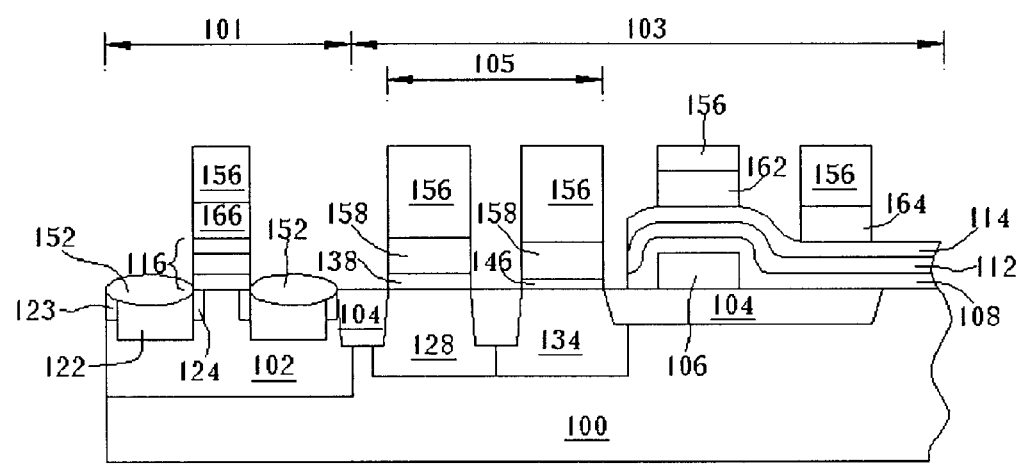

As shown in FIG. 19, then form a polysilicon layer 154 on the semiconductor substrate 100. The polysilicon layer 154 covers all of the memory area 101 and the periphery area 103. Then, as shown in FIG. 20, perform a fifth photolithography process in order to form a patterned fifth photoresist layer 156 on the polysilicon layer 154, the fifth photoresist layer 156 defining a plurality of gate patterns, the pattern of the top electrode of the capacitor, and a resistor pattern in the periphery area 103, and the control gate pattern in the memory area 101. Then perform an anisotropic etching process in order to remove the polysilicon layer 154 not covered by the fifth photoresist layer 156 and form two gates 158, a top electrode 162 of the capacitor, and a resistor 164 in the periphery area 103, and a control gate 166 in the memory area 101. Finally, remove the fifth photoresist layer. Additionally, the ONO dielectric layer 116 below the resistor 164 can be removed in one of the previous photolithography and etching processes.

Figure 21:
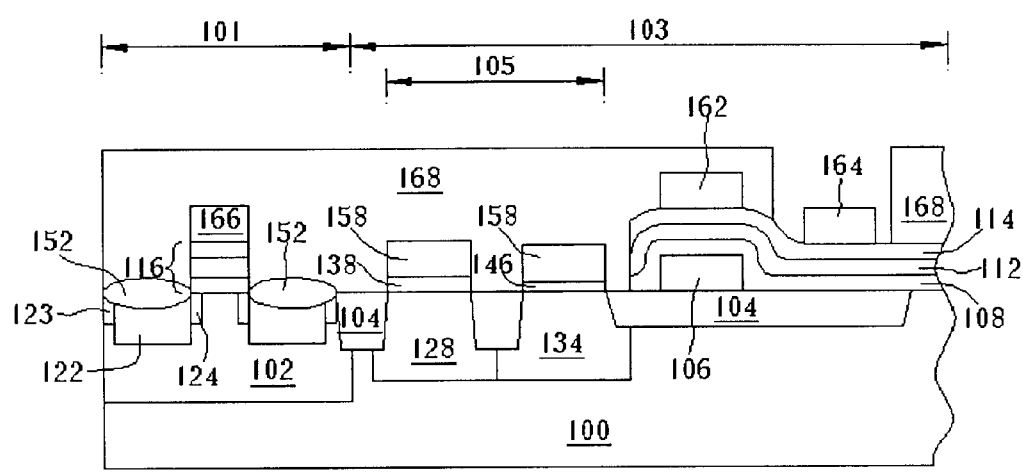

As shown in FIG. 21, then perform a sixth photolithography process in order to form a sixth photoresist layer 168. The sixth photoresist layer 168 exposes a resistor region 164 in the periphery area 103 and covers the memory area 101 and other portions of the periphery area 103. Thereafter, perform an ion implantation process in order to adjust the resistivity value of the resistor 164 by implanting P-type ions or N-type ions with specific dosage into the resistor 164 regions. After that, remove the sixth photoresist layer 168.

After completing the ion implantation process of the resistor 164, perform the manufacturing process of the lightly doped drain (LDD), the spacer at either side of the gate 158, and the source/drain in the periphery area 103 in order to complete the manufacturing of the MOS transistor in the periphery area 103. Of course, the ion implantation process for the resistor 164 can be performed in the subsequent manufacturing process of the source/drain at either side of the gate 158 if the processing conditions are compatible.

The method of forming a nitride read only memory (NROM) embedded with mixed-signal circuits on a semiconductor substrate according to the present invention has the following advantages:

(1) A method of forming a nitride read only memory (NROM) embedded with mixed-signal circuits on a semiconductor substrate is provided, so as to achieve an objective of forming a system on chip (SOC).

(2) Preserving the different dielectric layers of the capacitor by adjusting the cleaning and etching process. Furthermore, providing the capacitor with a varied dielectric constant in order to match the mixed-signal circuits.

(3) Making the control gate of the NROM, the top electrode of the capacitor, the resistor and the gate of the MOS in the periphery area with the same polysilicon layer in order to reduce the process steps and complexity of manufacturing.

In contrast to the prior art of forming the mixed-signal circuits comprising flash ROM, the present invention uses NROM instead of flash ROM and provides an etching process for the dielectric layer of the capacitor to simplify the manufacturing method. Therefore, not only is the objective of having a multi-storage function achieved, but the process flexibility is also increased and the manufacturing cost is reduced.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of forming an Nitride read only memory (NROM) embedded with mixed-signal circuits on a semiconductor substrate, the surface of the semiconductor substrate divided into at least a memory area and a periphery area, the periphery area comprising a plurality of active areas isolated by an isolation layer, the method comprising:

forming a bottom electrode layer of a capacitor on the isolation layer in the periphery area;

performing an oxide-nitride-oxide (ONO) process to form an ONO dielectric layer comprising a top oxide layer, a silicon nitride layer and a bottom oxide layer on the surface of the semiconductor substrate that covers the surface of the bottom electrode of the capacitor;

performing a first lithography process to form a patterned first photoresist layer on the surface of the ONO dielectric layer, the first photoresist layer defining a plurality of bit line patterns in the memory area and covering the periphery area;

performing a first anisotropic etching process to etch the ONO dielectric layer not covered by the first photoresist layer;

performing a first ion implantation process to form a plurality of buried bit lines in the semiconductor substrate not covered by the first photoresist layer in the memory area;

removing the first photoresist layer;

performing a second photolithography process to form a patterned second photoresist layer on the surface of the semiconductor substrate, the second photoresist layer defining ion implantation well regions in the periphery area and covering regions atop the bottom electrode of the capacitor and all of the memory area;

performing a second anisotropic etching process to etch the ONO dielectric layer not covered by the second photoresist layer in the periphery area;

performing a second ion implantation process, utilizing the second photoresist layer as a mask, to form at least one ion well in the semiconductor substrate not covered by the second photoresist layer in the periphery area;

removing the second photoresist layer;

performing a wet etching process to etch and clean the surface of the active area in the periphery area;

peforming at least one oxidation process to form at least one gate oxide layer with a specific thickness on the active area in the periphery area and form a thermal oxide layer atop each of the buried bit lines in the memory area;

forming a polysilicon layer on the semiconductor substrate;

performing a third photolithography process to form a patterned third photoresist layer on the polysilicon layer, the third photoresist layer defining a gate pattern, a pattern of a top electrode of the capacitor and a resistor pattern in the periphery area, and a word line pattern in the memory area;

performing a third anisotropic etching process to remove the polysilicon layer not covered by the third photoresist layer and form at least a gate, the top electrode of the capacitor and a resistor in the periphery area, and a word line in the memory area; and removing the third photoresist layer.

2. The method of claim 1 further comprising a fourth photolithography process to form a patterned fourth photoresist layer on the semiconductor substrate before the wet etching process, the fourth photoresist layer exposing the active area in the periphery area and covering the memory area.

3. The method of claim 1 further comprising a fifth photolithography process to form a patterned fifth photoresist layer on the semiconductor substrate before the wet etching process, the fifth photoresist layer exposing the periphery area and covering the memory area so that the wet etching process simultaneously removes the top oxide layer of the ONO dielectric layer atop the bottom electrode of the capacitor.

4. The method of claim 3 wherein an etching solution for the wet etching process comprises a hydrofluoric acid (HF) solution.

5. The method of claim 1 further comprising a sixth photolithography process to form a patterned sixth photoresist layer on the semiconductor substrate before the wet etching process, the sixth photoresist layer exposing the periphery area and covering the memory area, the wet etching process simultaneously removing the top oxide layer and the silicon nitride layer of the ONO dielectric layer atop the bottom electrode of the capacitor.

6. The method of claim 5 wherein an etching solution for the wet etching process comprises a hydrofluoric acid (HF) soultion and a hot phosphoric acid solution.

7. The method of claim 1 wherein the bottom electrode of the capacitor is composed of in-situ polysilicon.

8. The method of claim 1 wherein the first anisotropic etching process and the second anisotropic etching process respectively remove the top oxide layer and the silicon nitride layer not covered by the first photoresist layer and the second photoresist layer down to the surface of the bottom oxide layer in the ONO dielectric layer.

9. The method of claim 1 wherein the polysilicon layer additionally comprises a metal silicide layer.

10. The method of claim 1 wherein a thickness of the thermal oxide layer is two times to three times the specific thickness of the gate oxide layer in the periphery area.

11. The method of claim 1 wherein the method of forming the resistor further comprises:

performing a seventh photolithography process to form a patterned seventh photoresist layer on the surface of the semiconductor substrate, the seventh photoresist layer exposing a resistor region and covering the memory area and an area outside of the resistor region in the periphery area;

performing a third ion implantation process; and removing the seventh photoresist layer.

12. The method of claim 11 wherein the third ion implantation process is a P ion implantation process.

13. The method of claim 11 wherein the third ion implantation process is an N ion implantation process.

14. A method of forming an Nitride read only memory (NROM) embedded with mixed-signal circuits on a semiconductor substrate, the surface of the semiconductor substrate divided into at least a memory area and a periphery area, the periphery area comprising a plurality of active areas isolated by an isolation layer, the method comprising:

forming at least a bottom electrode of a capacitor on the isolation layer in the periphery area;

performing an oxide-nitride-oxide (ONO) process to simultaneously form an ONO dielectric layer comprising a top oxide layer, a silicon nitride layer, and a bottom oxide layer on the surface of the semiconductor substrate, and an NO dielectric layer comprising a top oxide layer and a silicon nitride layer on the surface of the bottom electrode of the capacitor;

performing a first photolithography process to form a patterned first photoresist layer on the surface of the ONO dielectric layer, the patterned first photoresist layer defining a plurality of bit line patterns in the memory area and covering the periphery area;

performing a first anisotropic etching process to etch the ONO dielectric layer not covered by the first photoresist layer;

performing a first ion implantation process to form a plurality of buried bit lines in the semiconductor substrate not covered by the first photoresist layer in the memory area;

removing the first photoresist layer;

performing a second photolithography process to form a patterned second photoresist layer on the surface of the semiconductor substrate, the second photoresist layer defining ion implantation well regions in the periphery area and covering regions atop the bottom electrode of the capacitor and all of the memory area;

performing a second anisotropic etching process to etch the ONO dielectric layer not covered by the second photoresist layer in the periphery area;

performing a second ion implantation process, utilizing the second photoresist layer as a mask, to form at least one ion well in the semiconductor substrate not covered by the second photoresist layer in the periphery area;

removing the second photoresist layer;

performing a wet etching process to etch and clean the surface of the active area in the periphery area;

performing at least one oxidation process to form at least one gate oxide layer with a specific thickness on the active area in the periphery area and form a thermal oxide layer atop each of the buried bit line in the memory area;

forming a polysilicon layer on the semiconductor substrate;

performing a third photolithography process to form a patterned third photoresist layer on the polysilicon layer, the third photoresist layer defining a gate pattern, a pattern of a top electrode of the capacitor and a resistor pattern in the periphery area, and a word line pattern in the memory area;

performing a third anisotropic etching process to remove the polysilicon layer not covered by the third photoresist layer and form at least a gate, the top electrode of the capacitor and a resistor in the periphery area, and a word line in the memory area; and removing the third photoresist layer.

15. The method of claim 14 wherein the bottom electrode of the capacitor is a metal layer.

16. The method of claim 15 wherein the metal layer is a tungsten layer, a chrome layer, or an aluminum layer.

17. The method of claim 14 wherein the bottom electrode of the capacitor is a polysilicon layer and a metal silicide layer stacked structure.

18. The method of claim 17 wherein the metal silicide layer is a tungsten silicide layer.

19. The method of claim 14 further comprising a fourth photolithography process to form a patterned fourth photoresist layer on the semiconductor substrate before the wet etching process, the fourth photoresist layer exposing the active area in the periphery area and covering the memory area.

20. The method of claim 14 further comprising a fifth photolithography process to form a patterned fifth photoresist layer on the semiconductor substrate before the wet etching process, the fifth photoresist layer exposing the periphery area and covering the memory area, the wet etching process removing the top oxide layer in the NO dielectric layer atop the bottom electrode of the capacitor.

21. The method of claim 20 wherein an etching solution for the wet etching process comprises a hydrofluoric acid (HF) solution.

22. The method of claim 14 wherein the first anisotropic etching process and the second anisotropic etching process respectively remove the top oxide layer and the silicon nitride layer not covered by the first photoresist layer and the second photoresist layer down to the surface of the bottom oxide layer in the ONO dielectric layer.

23. The method of claim 14 wherein the polysilicon layer additionally comprises a metal silicide layer.

24. The method of claim 14 wherein a thickness of the thermal oxide layer is two times to three times the specific thickness of the gate oxide layer in the periphery area.

25. The method of claim 14 wherein the method of forming the resistor further comprises:

performing a sixth photolithography process so as to form a patterned sixth photoresist layer on the surface of the semiconductor substrate, the sixth photoresist layer exposing a resistor region and covering the memory area and an area outside of the resistor region in the periphery area;

performing a third ion implantation process; and removing the sixth photoresist layer.

26. The method of claim 25 wherein the third ion implantation process is a P ion implantation process.

27. The method of claim 25 wherein the third ion implantation process is an N ion implantation process.

* * * * *